United States Patent [19]

Daems et al.

[11] Patent Number: 5,043,247

[45] Date of Patent: Aug. 27, 1991

[54] PROCESS FOR THE FORMATION OF MULTICOLOR COLLOID PATTERNS

[75] Inventors: Eddie R. Daems; Luc H. Leenders, both of Herentals, Belgium

[73] Assignee: Agfa Gevaert, N.V., Mortsel, Belgium

[21] Appl. No.: 498,404

[22] Filed: Mar. 26, 1990

[30] Foreign Application Priority Data

Mar. 29, 1989 [EP] European Pat. Off. ........ 89200795.6

[51] Int. Cl.$^5$ .......................... G03C 1/90; G03C 11/12
[52] U.S. Cl. ..................................... 430/257; 430/256; 430/262; 430/263; 430/952
[58] Field of Search ............... 430/257, 256, 259, 262, 430/952, 263

[56] References Cited

U.S. PATENT DOCUMENTS

| | | | |
|---|---|---|---|
| 3,642,474 | 2/1972 | Lodewijk et al. | 430/257 |
| 4,033,770 | 7/1977 | De Haes et al. | 430/256 |
| 4,427,757 | 1/1984 | Beebe et al. | 430/952 |
| 4,701,401 | 10/1987 | Leenders et al. | 430/257 |
| 4,710,444 | 12/1987 | Leenders et al. | 430/257 |
| 4,877,712 | 10/1989 | Namiki et al. | 430/257 |

*Primary Examiner*—Richard L. Schilling
*Attorney, Agent, or Firm*—William J. Daniel

[57] ABSTRACT

A process for forming a line art of halftone multicolor colloid pattern involves the contact exposure in registration of different colored silver halide emulsion hydrophilic colloid layers each on a temporary support and the hardening development of the individual exposed silver halide emulsion layers in turn after each is transferred to a common intermediate support to form thereon a multi-layer assembly of reverse reading color relief images on top of each other. This assembly together with an underlying stripping layer from the intermediate support is transferred bodily onto a permanent support by adherence to an adhesive layer carried on the latter support to form thereon a right-reading multicolor image that may serve as a color proof.

11 Claims, No Drawings

PROCESS FOR THE FORMATION OF MULTICOLOR COLLOID PATTERNS

FIELD OF THE INVENTION

The present invention relates to an improved process for the formation of line art or halftone multicolour colloid patterns.

BACKGROUND OF THE INVENTION

The production of line art or halftone multicolour colloid patterns is important commercially in the field of design, e.g. in the production of colour decorative patterns, colour wiring and circuit diagrams, cartography, colour proofing, the preparation of transparencies for projection in transmission or the preparation of opaque prints for overhead projection in a reflection mode.

Especially in the colour field of the graphic art there is a great need for a simple and fast technique offering "colour proofs" of high quality and reproducibility.

Photographically produced colour proofs are a substitute for multicolour halftone reproductions as are produced by successive printing in registration with the separate standard inks: magenta, yellow, cyan and black on a conventional printing press. A process for the production of colour proofs by preparing a printing plate and running the plate on the press to produce only a few copies as proof of the quality of the halftone separation transparencies used in the exposure is a very expensive procedure and therefore more economic photographic systems have been developed to obtain a similar result by means of which the appearance of a print starting from particular colour separation negatives or positives can be judged by the printer and client.

According to a process known from U.S. Pat. No. 3,642,474 the production of such a proof in the form of superposed coloured colloid patterns, employs a plurality of hydrophilic differently coloured colloid layers, each of which is hardened by irradiation by means of an active species formed during or after an informationwise exposure to active electromagnetic radiation of a photosensitive substance, and comprises the following steps:

(1) transferring a coloured hydrophilic colloid layer containing said photosensitive substance and a hydrophilic colloid which undergoes a reduction in solubility in water by said active species, from a relatively hydrophilic temporary support to a less hydrophilic permanent support by pressing the latter in the presence of an aqueous liquid against said colloid layer, and removing the temporary support, thus leaving the said layer on the permanent support;

(2) exposing the transferred colloid layer in substantially dry state to active electromagnetic radiation, which is modulated according to the information to be recorded, (3) hardening developing the exposed layer by means of an aqueous liquid followed by a wash-off processing resulting in a coloured relief pattern, and repeating the steps (1), (2) and (3) with said other differently coloured hydrophilic colloid layers to form superposed coloured colloid patterns on a single permanent support.

In the above process for the production of colour proofs, the imagewise exposure proceeds in a vacuum frame with the particular separation image of the multicolour pattern to be reproduced in contact with the coloured hydrophilic colloid layer on the permanent support.

The several contact exposures proceed in registration on the same permanent support which received the unexposed coloured imagewise hardenable hydrophilic colloid layers by transfer one-by-one from a temporary support, each transfer and exposure being followed by imagewise hardening, wash-off processing and a drying step so as to form an additional selected colour pattern on top of an already formed one.

The above sequence of processing steps as defined in U.S. Pat. No. 3,642,474 is not suited for rapid access imaging in that each exposure step is interrupted by wet processing steps and a drying step so that the production of a 4-colour proof takes at least 22 minutes.

A more rapid multicolour image production is possible by a change in the sequence of handling so that each contact exposure of a selected monochrome layer takes place while that layer is on its own temporary support and is not delayed by processing steps. The exposed layers are transferred in registration and processed after being individually transferred to the same permanent support. Such procedure although giving a quicker access to the final multicolour image has the important disadvantage that by transferring the exposed layer onto the permanent support a reverse reading image is obtained thereon when as is necessary for obtaining optimal image resolution and sharpness the contact exposure of the photosensitive hardening developable coloured hydrophilic colloid layer on the temporary support has been carried out with the hardening developable layer in contact with the image side of the selected colour separation negative or positive. Indeed, since in lithographic printing by the offset process the plates must be straight or right reading, the line and/or halftone colour separation images used for the desired contact-exposure of the plates are reverse or wrong reading as seen from the image-bearing side.

OBJECTS OF THE INVENTION

It is an object of the present invention to provide a rapid access process for the formation of a right reading line art or halftone multicolour colloid pattern that may serve as a multicolour proof solving the above mentioned problem related to the contact exposure technique giving reverse reading images.

Other objects and advantages of the present invention will become clear from the further description.

SUMMARY OF THE INVENTION

In accordance with the present invention a process for forming a line art or halftone multicolour colloid pattern reproduction of a multicoloured original provided which process comprises the following steps:

(1) individually exposing in registration a plurality of differently coloured hardening developable photographic materials each comprising a temporary unsubbed hydrophobic organic resin support carrying in weakly adhering relation thereon a photosensitive coloured carrying developable hydrophilic colloid-silver halide emulsion layer, adapted upon hardening development to generate an active species for the hardening of the hydrophilic colloid binder of said emulsion layer, wherein during said exposure said hardenable developable silver halide emulsion layer stands in direct contact with the silver halide emulsion layer side of a developed photographic silver halide emulsion material representing a negative or positive separation image of monochrome information contained in said multicolour original, (2) transferring integrally in registration the coloured silver halide emulsion layer of one of said contact exposed photographic materials onto an intermediate support carring a stripping layer, having a moderat adherence for the coloured colloid emulsion layer said transferring proceeding by pressing said exposed silver halide emulsion layer in the presence of an aqueous liquid against the stripping layer on the intermediate support, (3) hardening developing the transferred exposed coloured colloid emulsion layer by means of a hardening developing agent to generate said active species whereby imagewise hardening of the hydrophilic colloid of said imagewise exposed coloured colloid emulsion layer takes place, and removing by wash-off processing the non-hardened regions to leave a hardened coloured relief image on said intermediate support, (4) producing a multicolour pattern of multi-layer assembly of superposed differently coloured relief images on the same intermediate support by repeating the steps (1), (2) and (3), the exposures being executed for forming different images in the differently coloured hardening developable colloid emulsion layers and the transfers of the differently exposed layers proceeding in registration on top of any already formed relief images on said intermediate support, and (5) transferring in entirely said assembly of differently coloured relief images from said intermediate support onto a permanent support by pressing the assembly into contact with a strongly adhering adhesive layer carried on a permanent carrier sheet and by peeling away the intermediary support leaving its stripping layer and said assemblage adhering on the permanent support.

Optionally in said process a bleachfix treatment is applied to remove before or after wash-off treatment the developed silver, thereby yielding a more bright and colour-pure image.

GENERAL DESCRIPTION OF THE INVENTION

The adhering power of each transferable exposed hydrophilic colloid-silver halide emulsion layer to its temporary support is less in a moist state than in a dry state which makes an easy stripping possible by wetting said layer while pressing it in contact with the intermediate support which itself is pre-wetted before such pressure contact.

In order to ensure an easy separation and transfer of the moist hydrophilic colloid-silver halide emulsion layer a temporary support is chosen which has a relatively strong hydrophobic surface which means that it is not subbed for improving its adherence to hydrophilic colloid layers. Therefore, preference is given to unsubbed hydrophobic resin sheet material, e.g. made of cellulose triacetate, polystyrene, polyester or copoly(vinyl acetate/vinylchloride). Said resin material may be coated on a metal or paper support. On absorbing water and swelling a hydrophilic colloid-silver halide emulsion layer becomes easily peelable from these supports and transferable to a less hydrophobic surface of the intermediate support comprising a more strongly adhering stripping layer.

The silver halide emulsion layer present on the temporary support may contain any kind of photosensitive silver halide grains and incorporates a diffusion-resistant colorant, pigment or dye, in a substantially nonhardened gelatin binder.

The hydrophilic colloid of the hardening developable silver halide emulsion layers used according to the present invention is preferably a substantially unhardened gelatin as described in U.S. Pat. No. 3,364,024.

According to an embodiment said silver halide emulsion layer is itself free from colouring matter but is applied onto a hardenable non-photosensitive hydrophilic coloured colloid layer wherein during processing oxidized tanning developing agent can diffuse to effect therein an imagewise hardening developing reaction congruent with the reaction taking place in the non-coloured silver halide emulsion layer. Photographic silver halide emulsion materials containing a pigmented hydrophilic colloid layer adjacent to a hardening developable silver halide emulsion layer are described in GB-P 1,072,862 and corresponding U.S. Pat. No. 3,364,024.

For obtaining sharp non-blurring images in the production of superposed multicolour colloid patterns according to the present invention preferably colouring matter highly resistant to diffusion in the hydrophilic colloid binder of the hardenable layer and chemically inert in the processing and washing liquids is used.

When used in colour proofing, the colouring matter has to match with the absorption spectrum of the standard printing inks as close as possible.

Information about standard colour inks can be found in H. M. Cartwright's —Ilford Graphic Arts Manual (1962) Vol. I—pages 502 to 504.

There exist "cold" and "warm" colour standards. Cold colour tones are, e.g. standardized in the U.S.A. in the GATF-Colour Charts and in the German Standards DIN 16508 and 16509. Warm colour tones are standardized, e.g. in the German Standard DIN 16538.

The cold colour standards are characterized by the use of substantially pure magenta pigments, mostly insolubilized rhodamine and phloxine-dyes, which have a very low side absorption in the blue region of the spectrum.

The warm colour standards are characterized by the use of insolubilized azo dyestuffs. Said dyestuffs are more resistant to solvents, e.g. alcohol, than the rhodamines and phloxines, but they possess a much higher side absorption in the blue region of the spectrum.

It has been found experimentally that pigments, which are insoluble or very poorly soluble in water and in organic liquids of the alcohol or polyhydric alcohol type, e.g. glycerol, fulfil the requirements of resistance to diffusion. Pigment dyes that are applied from an aqueous dispersion are used preferably, though the use of substantive dyes that are chemically linked to a colloid or polymer is not excluded. For colour proofing purposes, the hardenable colloid layer contains pigments and/or dyes in a concentration sufficiently high that the optical density in the wavelength range of maximum absorption is at least 0.35.

Apart from the use of non-diffusing dyes or pigments, the absorption spectrum of which has to satisfy particular requirements for colour proofing, all colours are considered e.g. cyan, light-cyan, magenta, warm magenta, black, yellow, green, brown, orange, red, white or blue as well as metallic colours such as pale gold, rich gold, copper, and silver. In other words, the term "colour" in the present invention encompasses all pure and mixed colours as well as black and white.

Non-migratory pigments suitable for use in the present invention are known organic pigments, e.g. obtainable under the Trade Marks "PIGMOSOL" and "COLANYL" dyes. "PIGMOSOL" and "COLANYL" are organic pigments that are mixed with a dispersing agent for an aqueous medium. These pigments excel in resistance to light, heat, acids, bases, oxidizing agents, and solvents. They are insoluble in hydrophilic colloids such as gelatin.

When in addition to the cyan, magenta and yellow relief patterns a black relief pattern is formed in colour proofing, preferably carbon black is used. Apart from carbon black mixtures of coloured pigments may be applied as described e.g. in U.S. Pat. No. 4,427,757.

In order to obtain images with a good line or dot sharpness preferably a temporary support is used that carries on the side opposite the silver halide emulsion layer an anti-reflection coating, also called anti-halation coating, e.g. on the basis of carbon black dispersed in a gelatin binder.

Line or dot sharpness and resolution can be further improved by using relatively thin pigment-coloured hardening developable silver halide emulsion coatings containing a screening dye, e.g. tartrazine (C.I. 19,140) that can be leached out by the alkaline aqueous developing liquids used in the processing of the silver halide. Preferably silver halide emulsion layers having a thickness in the range of 1 $\mu$m and 15 $\mu$m are used. Good results are obtained with coloured layers containing 1 to 10 g of gelatin per sq.m.

According to a preferred embodiment, the intermediate support for use according to the present invention is a cellulose triacetate resin sheet directly coated with a stripping layer on the basis of a mixture of nitrocellulose and ethyl cellulose, e.g. in the range by weight of 1/1 to 97/3. This stripping layer is provided with a wettable hydrophilic top coat on the basis of a mixture of gelatin, maleic anhydride and nitrocellulose wherein the gelatin is predominate, e.g. a mixture in which the weight ratio of the ingredients in the order given is 10/1.25/4.

Other examples of suitable stripping layers are described in published EP-A 0 252 765.

The permanent support is a rigid or flexible sheet material comprising an adhesive layer or such layer that obtains in situ adhesive properties through the action of a pressure, heat or aqueous wetting treatment or a combination of said treatments. The relative sticking power of the stripping layer and said adhesive layer towards the multi-layer assembly of hardening developed coloured hydrophilic colloid-emulsion relief portions and said topcoat of the stripping layer is such that in the transfer step the multi-layer relief assembly together with the above described top coat and stripping layer can be torn away from the intermediary support and transferred as a whole onto the permanent support.

Depending on the use of the multicolour print, the permanent support and/or its adhesive layer is transparent or opaque. So, the carrier part of the permanent support may be made of metal, glass, ceramics, organic resin or paper.

Permanent resin supports can be made opaque by coating them with a matted subbing layer or by matting or colouring them in the mass. The matting may be effected by pigments known therefor in the art, e.g. titanium dioxide, zinc oxide, and barium sulphate. Matting can also be obtained by producing a "blushcoat" as described e.g. in United Kingdom Patent Specification 943,681.

Particularly suitable opaque permanent supports for use in colour proofing are described in unpublished European Patent Application No. 8701655.5. These supports are paper supports coated with a polyolefin layer and a hardened hydrophilic colloid binder layer containing titanium dioxide pigment particles, which particles have an average grain size in the range of 200 to 450 nm, are present for at most 300% by weight with respect to the total binder content and are applied at a coverage of at least 0.5 g per m2. By varying the binder/pigment ratio these supports are suited to control the dot gain and to simulate the dot gain in halftone prints obtained by printing with ink on different paper stock.

According to a preferred embodiment, the adhesive layer of the permanent support is made of a pressure-sensitive adhesive which is composed substantially of (a) thermoplastic polymer(s) having some elasticity and tackiness at room temperature (20° C.). The tackiness is controlled optionally with a plasticizer and/or tackifying resin. A thermoplastic polymer is completely plastic if there is no recovery on removal of stress and completely elastic if recovery is instantaneous and complete.

Examples of pressure-sensitive adhesive resins are described in U.S. Pat. No. 4,033,770 for use in the production of adhesive decalcomanias by the silver complex diffusion transfer process, in the Canadian Patent 728,607 and in U.S. Pat. No. 3,131,106.

Particularly suitable pressure-sensitive adhesives are selected from the group of polyterpene resins, low density polyethylene, a copoly(ethylene/vinyl acetate), a poly(C1-C16)alkyl acrylate, a mixture of poly(C1-C1-6)alkyl acrylate with polyvinyl acetate, and copoly(vinyl acetate/acrylate being tacky at 20° C.

In the production of a pressure-adhesive layer an intrinsically non-tacky polymer may be tackified by the addition of a tackifying substance, e.g. a plasticizer or tackifying resin.

Examples of suitable tackifying resins are the terpene resins described in the periodical "Adhesive Age", Vol. 31, No. 12, November 1988, p. 28–29.

A survey of pressure and/or heat-sensitive adhesives is given by J. Shields in "Adhesives Handbook", 3rd. ed. (1984), Butterworths—London, Boston, and by Ernest W. Flick in "Handbook of Adhesive Raw Materials" (1982), Noyens Publications, Park Ridge, New Jersey—USA.

Before use in the transfer stripping step a pressure-sensitive adhesive layer is preferably protected against mechanical damage by a protective strippable temporary covering sheet which is e.g. a siliconized paper sheet, e.g. siliconised vegetable parchment or glassine paper as described in Research Disclosure, March 1977 item 15513 under the title "Image transfer material".

A layer that can be made adhesive in situ by wetting with water is e.g. an unhardened or poorly hardened gelatin layer containing optionally plasticizing latex particles with glass transition temperature (Tg) below 20° C. and/or a plasticizing agent for gelatin such as glycerol or derivatives of ethylene glycol containing ester and/or ether linkages.

The photosensitive silver halide used in the present invention may comprise silver chloride, silver bromide, silver bromoiodide, silver chlorobromoiodide and the like, or mixtures thereof. The silver halide emulsions may be coarse or fine grain and can be prepared by any of the well known procedures, e.g., single jet emulsions, double jet emulsions, such as Lippmann emulsions, ammoniacal emulsions, thiocyanate- or thioether-ripened emulsions such as those described in U.S. Pat. Nos. 2,222,264 of Adolph H. Nietz and Frederick J. Russell, issued Nov. 19, 1940, 3,320,069 of Bernard D. Illingsworth, issued May 16, 1967, and 3,271,157 of Clarence E. McBride, issued Sept. 6, 1966. Surface image emulsions may be used or internal image emulsions may be used such as those described in U.S. Pat. Nos. 2,592,250 of Edward Philip Davey and Edward Bowes Knott, issued Apr. 8, 1952, 3,206,313 of Henry D. Porter, Thomas H. James and Wesley G. Lowe, issued Sept. 14, 1965, and 3,447,927 of Robert E. Bacon and Jean F. Barbier, issued June 3, 1969. The emulsions may be regular-grain emulsions such as the type described by Klein and Moisar in J. Photogr. Sci., Vol. 12, No. 5, Sept./Oct. 1964, pp. 242-251. If desired, mixtures of surface and internal image emulsions may be used as described in U.S. Pat. No. 2,996,382 of George W. Luckey and John C. Hoppe, issued Aug. 15, 1961.

In addition to negative working silver halide emulsions that are preferred for their high light sensitivity, direct positive silver halide emulsions may be used that produce a positive silver image and a corresponding imagewise distribution of developing agent oxidation products during their development. For example, those direct positive silver halide emulsions are appropriate wherein by exposure or by a chemical treatment a developable fog has been produced, which is destroyed imagewise during the imagewise exposure when certain conditions are fulfilled. In the unexposed areas, the fog is maintained so that during the subsequent development a direct positive silver image is obtained and in correspondence therewith an imagewise distribution of oxidized hardening developing agent.

For example, direct positive emulsions of the type described in P.J. Hillson, U.S. Pat. No. 3,062,651, may be utilized to obtain direct positive images. In emulsions of this type, a nonhardening fogging agent such as stannous chloride, formamidine sulfinic acid, or the like is used.

More details about composition, preparation and coating of silver halide emulsions are described, e.g., in Product Licensing Index, Vol. 92, Dec. 1971, publication 9232, p. 107-109.

The emulsions can be chemically sensitized, e.g. by adding sulphur-containing compounds, e.g. allyl isothiocyanate, allyl thiourea, sodium thiosulphate and the like, during the chemical ripening stage. Also reducing agents, e.g. the tin compounds described in the Belgian Patent Specifications 493,464 and 568,687, and polyamines such as diethylenetriamine or derivatives of aminomethane-sulphonic acid, e.g. according to the Belgian Patent Specification 547,323, can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65-72 (1951).

Further it is possible to sensitize the emulsions with polyalkylene oxide derivatives, e.g. with polyethylene oxide having a molecular weight between 1000 and 20,000, or with condensation products of alkylene oxides and aliphatic alcohols, glycols, cyclic dehydration products of hexitols, alkylsubstituted phenols, aliphatic carboxylic acids, aliphatic amines, aliphatic diamines and amides. The condensation products have a molecular weight of at least 700, preferably of more than 1000.

For obtaining special effects these sensitizers of course can be combined with each other as described in Belgian Patent Specification 537,278 filed Apr. 12, 1955 and UK Patent Specification 727,982.

The spectral photosensitivity of the silver halide has to comply with the spectral composition of the exposure light used in the contact exposure. For a proper spectral sensitization the usual mono- or polymethine dyes such as acidic or basic cyanines, hemicyanines, oxonols, hemioxonols, styryl dyes or others, also tri- or polynuclear methine dyes, e.g. rhodacyanines or neocyanines may be used. Such spectral sensitizers are described, e.g., by F. M. HAMER in "The Cyanine Dyes and Related Compounds" (1964) Interscience Publishers, John Wiley & Sons, New York.

The silver halide emulsions may contain the usual stabilizers, e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxyl or amino groups. Compounds of this kind are described by BIRR in Z. Wiss. Photogr. Photophys. Photochem. 47, 2-27 (1952). Still other suitable stabilizers are amongst others heterocyclic mercapto compounds, e.g. phenylmercaptotetrazole, quaternary benzothiazole derivatives, benzotriazole and the like.

The hardening development proceeds with commonly used hardening developing agents, also called tanning developing agents, for effecting the development of the silver halide and producing oxidized developing agent acting as hardening agent for the hydrophilic colloid binder such as gelatin. Examples of suitable hardening developing agents are: 1,4-dihydroxy benzene compounds such as hydroquinone, chlorohydroquinone, bromohydroquinone, toluhydroquinone, morpholinemethyl hydroquinone, sulfohydroquinone and the like.

The developing agent may be incorporated in the silver halide emulsion layer or in a silver halide-free layer adjacent thereto so that development can be obtained by using an alkaline aqueous activator liquid.

According to a special embodiment said silver halide emulsion layer is combined with an underlying additional hardenable hydrophilic colloid layer containing an auxiliary developing agent forming a superadditive developing system with the hardening developing agent contained in the coloured silver halide emulsion layer.

Typical activator baths for a hardening developable photographic silver halide emulsion material comprise, for example, an aqueous solution of an alkaline material, such as sodium carbonate, sodium hydroxide, potassium carbonate, potassium hydroxide, mixtures of sodium hydroxide and sodium sulfite, hydroxyalkylamines, e.g. triethanolamine, etc. A suitable activator bath comprises e.g. about 2 percent by weight of sodium hydroxide and 0.5 percent by weight of sodium sulfite.

It will be appreciated that an auxiliary developing agent can be used along with a hydroquinone developing agent in order to improve the developing speed without disadvantageously affecting the wash-off processing of the invention. Typical auxiliary developing agents include 3-pyrazolidinone developing agents, e.g. 1-phenyl-3-pyrazolidinone, 1-phenyl-4,4-dimethyl-3-pyrazolidinone, 1-phenyl-4-methyl-4'-hydroxymethy-3-pyrazolidinone and N-methyl-p-aminophenol sulphate.

Said auxiliary developing agents or a mixture thereof may be incorporated in the photographic material and/or in the developing liquid in which the hardening developing agent may be absent when using an alkaline activator bath.

DETAILED DESCRIPTION OF ILLUSTRATIVE EMBODIMENTS

A detailed description is hereinafter set forth of composition and structure of a light-sensitive material and its use in the production of a multicolour image according to an embodiment of the present invention.

A coating composition is prepared containing gelatin dissolved in water wherein at least one selected pigment is dispersed in a concentration to yield after coating and drying a layer having an optical density in the wavelength range of maximal absorption of at least 0.4. In addition to said ingredients the coating composition contains phtosensitive silver halide grains to form a silver halide emulsion layer which contains optionally a hardening developing agent in an amount high enough to allow selective hardening of the gelatin by using in the development step an activator liquid. The coating composition contains preferably at least 50% by weight of gelatin in respect of the pigment particles and is applied preferably at a coverage of 1 to 10 g of gelatin per sq.m.

According to an alternative embodiment, a composite layer structure is used wherein the above defined silver halide emulsion layer is present as an underlying layer and said emulsion layer is coated with a seperate top layer containing 0.2 to 2.5 g of gelatin per sq.m and dispersed particles of a matting agent, e.g. polymethylmethacrylate micro-beads.

Said top layer and underlying silver halide emulsion layer form firmly bound together a "composite layer" which can be transferred as a whole from the temporary support to the intermediary support.

A set of materials each containing such a composite layer is preferably used for preparing a multicolour "colour proofing image". A usual set contains yellow, magenta, cyan, and black pigment coatings on separate unsubbed cellulose triacetate supports.

The transfer of the exposed silver halide emulsion colloid layer from its temporary support to the intermediate support can be carried out in an apparatus, in which the materials involved are pressed together between rollers, whereupon after pressing contact the peeling apart or stripping is effected manually.

An apparatus suitable for transferring a hydrophilic gelatin-silver halide emulsion layer from its temporary support to a pre-wetted intermediate support comprises a pair of co-operating pressure rollers, means for driving said rollers, and a first platform for supporting the pre-wetted intermediate support prior to its engagement by said pressure rollers. Said platform in order to reduce frictional contact has a corrugated structure to make discontinuous contact with the intermediate supPort when this is placed thereon. A second platform is arranged over and separate from the first one for supporting at least the leading part of the temporary support to keep said temporary support dry and separate from the wetted intermediate support when this is located on the first platform. The forward ends of said both platforms are disposed proximate to the nip of the pressure rollers so that the supports as they are advanced are gripped by said rollers and progressively pressed together for effecting the transfer of the exposed coloured silver halide emulsion layer. The apparatus and materials are provided with the necessary registering means for carrying out the succesive transfers in registration.

After the hardening development step effected on the intermediate support, the nonhardened portions of the developed silver halide emulsion layers are washed off without mechanical rubbing by means of running water at a temperature preferably between 30° and 50° C. Excess liquid is preferably removed by squeezing the relief between two smooth soft rollers, e.g. rubber rollers.

In order to obtain a multicolor print as a true reproduction of a multicolor original the same steps are carried out with four differently coloured silver halide emulsion layers having one of the substractive colours cyan, yellow, magenta, and black. After their contact-exposure in register the exposed silver halide emulsion layers are transferred in image registration on the same intermediate support whereon following each transfer the necessary hardening development and wash-off treatment is carried out to obtain a monochrome coloured relief image whereupon the next transfer of an exposed diffently coloured silver halide emulsion colloid layer takes place. The order wherein the monochrome colour relief images are made and transferred can be chosen arbitrarily.

The transfer on the permanent support of the multicolor relief assemblage may proceed in a conventional laminating device operating with pressure plates or pressure rollers.

In the transferred multicolour multi-layer colloid pattern assembly the transferred stripping layer acts as protective layer.

EXAMPLE OF THE INVENTION

The production of a multicolour proof is illustrated in more detail in the following examples. The ratios and percentages are by weight if not otherwise indicated.

EXAMPLE 1

Preparation of the Photographic Material with Temporary Support

On a temporary support of unsubbed cellulose triacetate having a thickness of 0.1 mm the following gelatin containing layers were applied in the order given:

(i) a silver chlorobromide-iodide emulsion (molar ratio 83.6/16/0.4) containing diffusion-resistant cyan coloured pigment and having a silver halide coverage equivalent with 0.25 g of silver per sq.m. and gelatin coverage of 1.4 g per sq.m. The cyan pigment being FLEXONYL BLUE Paste (C.I. Index Nr. 74,160) was applied at 6.3 g per liter of coating composition corresponding with 0.126 g of pigment solid per sq.m and to the coating composition the screening dye TARTRAZINE (C.I. 19140) was applied in an amount sufficient to obtain a coverage of 0.08 g per m2. The pH of the coating composition was 5.4; and (ii) a non-pigmented gelatin binder layer containing per sq.m 0.6 g of gelatin, and 0.07 g of matting agent being polymethyl methacrylate micro-beads having an average particle size of 3 $\mu$m.

Magenta, yellow and black pigment gelatin-emulsion coatings prepared in the same manner were applied to unsubbed cellulose triacetate temporary supports and overcoated as defined for the cyan pigmented coating above. The magenta pigment was HELIOECHTCARMIN BB TEIG (Colour Index Nr. 12,485) and the yellow pigment was HELIOECHTGELB GRN 7476 Feinteig (Colour Index Nr. 21,100). Said pigments were used in an amount of 14.5 g and 17.6 g respectively per liter of coating composition. In the black pigment coating carbon black was used in admixture with the above mentioned FLEXONYL BLUE in an amount of 15.75 g and 1.26 g respectively per liter of coating composition.

The Contact Exposure

In a contact exposure apparatus provided with an ultraviolet radiation source the above defined silver halide emulsion layers were contact-exposed in transmission each having their emulsion layer side in contact with the emulsion layer side of a corresponding colour separation image which is a halftone silver image having a reverse reading image when seen from the side of the developed silver halide emulsion layer.

Transfer to the Intermediate Support

A cellulose triacetate sheet having a thickness of 190 $\mu$m, coated with an 11 $\mu$m thick undermost layer consisting of a mixture of nitrocellulose and ethyl cellulose in a 87/13 weight ratio with thereon a 0.2 $\mu$m thick top layer of a mixture of gelatin, maleic anhydride and nitrocellulose in a weight ratio of 66/8/26 was pre-wetted with water at the top layer side and pressed against the contact-exposed cyan coloured silver halide emulsion layer on its temporary support in an apparatus described hereinbefore for carrying out the transfer of the exposed silver halide emulsion layer. The temporary unsubbed cellulose triacetate support was peeled away manually.

The Hardening Development

The transferred exposed composite coatings (i) and (ii) were hardening developed on the intermediate support by dipping it for 30 s in an aqueous liquid developing bath having following composition:

| | |
|---|---|
| potassium hydroxide | 15 g |
| potassium carbonate | 225 g |
| potassium bromide | 0.5 g |
| sodium sulphite | 5.0 g |
| hydroquinone | 3.0 g |
| 1-phenyl-3-pyrazolidinone | 5.0 g |
| mono sodium salt of ethylenediamine tetra-acetic acid | 2.0 g |

Thereupon the developed material was fed through a bleach-fix bath containing sodium thiosulphate and the mono sodium, iron(III) salt of ethylenediamine tetra-acetic acid.

The Wash-Off Processing

To obtain a cyan coloured relief image the hardening developed and bleach-fix processed material was wash-off processed with a warm (35° C.) water spray. The relief image was dried.

Following the production of said first cyan coloured relief image another contact-exposed differently coloured, e.g. magenta coloured, silver halide emulsion colloid layer was transferred on top of said resist image and hardening development, bleach-fixing and wash-off processing took place as described for the cyan coloured silver halide emulsion colloid layer.

That procedure was repeated succesively for the other coloured already exposed silver halide emulsion materials to form an assemblage of reverse reading differently coloured (cyan, magenta, yellow and black) relief images on top of each other on the same intermediate support.

Preparation of the Permanent Support

A permanent support being a double side polyethylene coated paper having a paper weight of 180 g/m2 and wherein each polyethylene layer has a coverage of 30 g/m2 was slide-hopper coated at one side at a wet coverage of 55 g per m2 with the following coating composition:

| | |
|---|---|
| distilled water | 199 ml |
| 20% latex of poly(methylmethacrylate-co-butadiene) (50/50) | 151 g |
| aqueous dispersion containing 2.86% of polymethylmethacrylate particles (average particle size 3 $\mu$m) and 9.5% of gelatin | 25.5 g |
| 21.4% aqueous dispersion of $TiO_2$ (average grain size 300 nm) containing 5.7% of gelatin | 544 g |
| 11.7% aqueous solution of saponine | 17 ml |
| as hardening agent a 20% aqueous solution of formaldehyde | 2.2 ml |
| distilled water up to | 1000 ml |

After drying onto the $TiO_2$-pigment coating an aqueous gelatin-latex coating composition was applied to obtain thereon an adhesive layer having adhesive character when wetted with water. Said coating contained 2 g of gelatin and 1.6 g of polyethylacrylate latex polymer per m2.

Said gelatin-latex layer may be applied from an aqueous coating composition and dried or be applied by transfer from an unsubbed cellulose triacetate support.

Transfer of the Multicolour Relief Image onto the Permanent Support

The transfer proceeded by conveying the intermediate support carrying the multicolour multi-layer relief pattern and superimposed stripping layer in contact with said adhesive layer of the pre-wetted permanent support between the nip of two pressure rollers. After drying for 2 minutes at 50° C. the stripping apart of the intermediary support proceeded manually leaving the assembly of superposed multicolour relief images together with the stripping layer adhering to the permanent support.

The time for carrying out the above described operation for forming a 4-colour halftone colour proofing pattern was only 16 minutes.

EXAMPLE 2

Example 1 was repeated but with another permanent support.

Said permanent support was a corona-treated polyethylene coated white paper support whereon a pressure-sensitive adhesive layer from a latex of polybutylacrylate elastomer at a dry thickness of 12 micron was applied.

The multicolour multi-layer relief formulas an assembly of reverse reading colour relief images was transferred by pressing the above permanent support with its pressure-sensitive adhesive layer in a roller laminator against the multi-layer relief image that together with the stripping layer was peeled apart from the intermediate support.

A 4-colour halftone colour proofing pattern was obtained in only 14 minutes.

We claim:

1. A process for forming a line art or halftone multicolour colloid pattern which process comprises the following steps:
   (1) Exposing one-by-one in registration a plurality of differently coloured hardening developable photographic materials each comprising a temporary unsubbed hydrophobic organic resin support carrying photosensitive coloured hardening developable hydrophilic colloid-silver halide emulsion layer, which upon hardening development generates an active species for the hardening of the hydrophilic colloid thereof while said hardening developable silver halide emulsion-colloid layer stands in direct contact with a silver halide emulsion material representing a negative or positive separation image of monochrome information contained in a multicolour image to be reproduced,
   (2) transferring integrally the coloured silver halide emulsion layer of each exposed photographic material onto an intermediate support carrying a stripping layer, by pressing the said colloid-silver halide emulsion layer in the presence of an aqueous liquid into contact with the stripping layer of the intermediate support and removing the temporary support,
   (3) hardening developing the transferred exposed coloured colloid-silver halide layer by means of a hardening development agent to generate said active species and effect imagewise hardening of the hydrophilic colloid of said imagewise exposed colloid-silver halide emulsion layer and removing by wash-off processing the non-hardened colloid portions thereof to leave a coloured relief image on said intermediate support,
   (4) producing a multicolour multi-layer pattern of an assembly of superposed differently coloured relief images on the same intermediate support by repeating the steps (1), (2), and (3), for each such photographic material, the exposures being executed for forming different images in the differently coloured hardening developable colloid-emulsion layers and the transfers of the differently exposed layers proceeding in registration on top of any already formed relief images on said intermediate support, and
   (5) transferring bodily said multi-layer assembly of differently coloured relief images from said intermediate support onto a permanent support carrying an adhesive layer by pressing the assembly into contact with such adhesive layer and peeling away the intermediate support leaving its stripping layer and said multi-layer assembly adhering on the permanent support as a multi-coloured relief image.

2. Process according to claim 1, wherein the photographic material comprises a nonsubbed hydrophobic resin film support carrying a coloured silver halide emulsion layer incorporating in a substantially nonhardened gelatin binder a silver halide tanning developing agent, photosensitive silver halide grains and pigment of the desired colour.

3. Process according to claim 1, wherein the hardenable colloid-emulsion layer is a composite of an uncoloured silver halide emulsion layer superimposed upon a separate hardenable pigment-coloured hydrophilic colloid layer wherein during development oxidized tanning developing agent can diffuse to effect in said colloid layer an imagewise hardening reaction congruent with the developing reaction taking place in the emulsion layer.

4. Process according to claim 1, wherein each hardenable coloured colloid-emulsion layer on its temporary support is overcoated with a colour-free hydrophilic colloid layer.

5. Process according to claim 1, wherein the temporary support is coated on the side opposite to the silver halide emulsion-colloid layer with an anti-reflection layer.

6. Process according to claim 1, wherein the silver emulsion-colloid layer contains a screening dye that can be removed in the hardening development processing.

7. Process according to claim 1, wherein the coloured silver halide emulsion layer has a thickness in the range of 1 $\mu$m and 15 $\mu$m and contains 1 to 10 g of gelatin per sq.m.

8. Process according to claim 1, wherein the temporary support is an unsubbed cellulose triacetate sheet.

9. Process according to claim 1, wherein the intermediate support is a cellulose triacetate resin sheet directly coated with a stripping layer comprised of a mixture of nitrocellulose and ethyl cellulose in the range by weight of 1/1 to 97/3.

10. Process according to claim 9, wherein said stripping layer is provided with a wettable hydrophilic top coat comprised of a mixture of gelatin, maleic anhydride and nitrocellulose wherein the gelatin is predominate in amount.

11. Process according to claim 1, wherein the permanent support is a rigid or flexible sheet material carrying a layer that acquires in situ adhesive properties under the action of a pressure, heat or aqueous wetting treatment or a combination thereof.

* * * * *